US00RE42302E

(19) United States
(12) Reissued Patent
Kotani et al.

(10) Patent Number: US RE42,302 E
(45) Date of Reissued Patent: *Apr. 19, 2011

(54) METHOD FOR MAKING A DESIGN LAYOUT AND MASK

(75) Inventors: Toshiya Kotani, Sagamihara (JP); Satoshi Tanaka, Kawasaki (JP); Soichi Inoue, Yokohama (JP)

(73) Assignee: Kabushiki Kaisha Toshiba, Kawasaki-shi (JP)

( * ) Notice: This patent is subject to a terminal disclaimer.

(21) Appl. No.: 11/905,862
(22) Filed: Oct. 4, 2007

Related U.S. Patent Documents

Reissue of:
(64) Patent No.: 6,507,931
Issued: Jan. 14, 2003
Appl. No.: 09/892,572
Filed: Jun. 28, 2001

U.S. Applications:
(63) Continuation of application No. 10/819,338, filed on Apr. 7, 2004.

(30) Foreign Application Priority Data

Jun. 30, 2000 (JP) ..... 2000-199839

(51) Int. Cl.
*G06F 17/50* (2006.01)
*G06F 9/455* (2006.01)
*G06F 11/22* (2006.01)

(52) U.S. Cl. ..... 716/132; 716/111; 716/119; 716/136

(58) Field of Classification Search ..... 716/2, 716/4–5, 8–10
See application file for complete search history.

(56) References Cited

U.S. PATENT DOCUMENTS

| | | | | |
|---|---|---|---|---|
| 5,416,722 A | | 5/1995 | Edwards | 364/491 |
| 5,984,510 A | | 11/1999 | Guruswamy et al. | 364/491 |
| 6,006,024 A | | 12/1999 | Guruswamy et al. | 716/12 |
| 6,077,310 A | * | 6/2000 | Yamamoto et al. | 716/19 |
| 6,209,123 B1 | | 3/2001 | Maziasz et al. | 716/14 |
| 6,343,370 B1 | * | 1/2002 | Taoka et al. | 716/21 |
| 6,470,489 B1 | | 10/2002 | Chang et al. | |
| 6,576,147 B2 | | 6/2003 | Mukai | |
| 7,103,870 B2 | | 9/2006 | Misaka et al. | |
| 7,181,707 B2 | | 2/2007 | Kotani et al. | 716/5 |
| 2004/0107410 A1 | * | 6/2004 | Misaka et al. | 716/8 |

FOREIGN PATENT DOCUMENTS

| | | |
|---|---|---|
| JP | 3-108738 | 5/1991 |
| JP | 8-287959 | 11/1996 |
| JP | 2854551 | 11/1998 |
| JP | 2000-182921 | 6/2000 |
| KR | 1996-35135 | 10/1996 |
| KR | 1999-62811 | 7/1999 |

OTHER PUBLICATIONS

John L. Nistler et al., "Large Area Optical Design Rule Checker for Logic PSM Application," SPIE vol. 2254 Photomask and X–Ray Mask Technology (1994), pp. 78–83.
Chaitali Sengupta et al., "An Integrated CAD Framework Linking VLSI Layout Editors and Process Simulators," SPIE vol. 2726, (1996) pp. 244–253.

* cited by examiner

*Primary Examiner*—Stacy A Whitmore
(74) *Attorney, Agent, or Firm*—Finnegan, Henderson, Farabow, Garrett & Dunner, L.L.P.

(57) ABSTRACT

A method for designing a semiconductor integrated circuit is provided which comprises compacting a design layout of a semiconductor integrated circuit on the basis of a given design rule to obtain a compacted pattern, predicting a pattern to be formed at a surface area of a wafer for forming the semiconductor integrated circuit on the basis of the compacted pattern, obtaining an evaluated value by comparing the predicted pattern with the compacted pattern, deciding whether the evaluated value satisfies a predetermined condition, and modifying the design rule when the evaluated value is decided as not satisfying the predetermined condition.

5 Claims, 2 Drawing Sheets

METHOD FOR MAKING A DESIGN LAYOUT AND MASK

Matter enclosed in heavy brackets [ ] appears in the original patent but forms no part of this reissue specification; matter printed in italics indicates the additions made by reissue.

CROSS-REFERENCE TO RELATED APPLICATIONS

*This application is a continuation of reissue application Ser. No. 10/819,338, filed Apr. 7, 2004, which is a reissue application of U.S. Pat. No. 6,507,931.* This application is *also* based upon and claims the benefit of priority from the prior Japanese Patent Application No. 2000-199839, filed Jun. 30, 2000, the entire contents of which are *also* incorporated herein by reference.

BACKGROUND OF THE INVENTION

1. Field of the Invention

The present invention relates to a semiconductor integrated circuit designing method and system and, in particular, to a semiconductor integrated circuit designing rule.

2. Description of the Related Art

In recent years, a marked advance has been made in the manufacturing technology of a semiconductor integrated circuit and the semiconductor integrated circuit of minimal working dimensions in the order of 0.20 μm has been mass produced. This very fine work process has been realized by a very fine pattern forming technology such as mask process technology, photolithography technology and etching technology.

At those time periods when a pattern size of the semiconductor circuit was adequately large, it was only necessary to prepare a mask pattern using a desired LSI pattern as an as-designed pattern. This mask pattern was transferred by a projection optical system on a photoresist on a wafer and, with a developed photoresist used as a mask, etching was performed. By doing so, it was possible to form a substantially as-designed pattern on the wafer.

With the ever advancing microminiaturization of patterns, however, it has been difficult to faithfully form that pattern and problems arise in that pattern configurations on the wafer are not formed as designed. In order to solve this problem, consideration has been paid to a CD shift in each process and a procedure (hereinafter referred to as a mask data processing) for forming a mask pattern different from a designed pattern has become important so as to allow a pattern configuration on the wafer to be formed as an as-designed pattern.

As the mask data processing, there are pattern calculation processing, mask data processing/preparation (MDP) processing for varying a mask pattern by a design rule checker (D.R.C.), etc., and optical proximity correction (OPC) processing for correcting an optical proximity effect (OPC), etc. By these, the mask pattern can be properly corrected such that pattern dimensions on the wafer are matched to the desired dimensions.

In a device, such as a logic device, requiring a short turnaround time (TAT), a greater processing time taken in the mask data processing provides a major increase in the TAT. In order to decrease the processing time for the mask data processing, it is necessary to make the design rule less strict, but, if this is so done, the chip size is increased.

In order to attain both an improved TAT and a reduced chip size, it is important that detailed discussions be held between the designer and the process developer about less strict design rule and time-reduced mask data processing. In the logic device requiring a greater time in a library development of cells or micro-cores, etc., it is necessary that, at an earlier time stage in which a process is not completely determined, the design rule be determined with the use of a lithography simulation, etc. Since the designer does the library development on the basis of a determined design rule, if the design rule is modified after the library development has been started, then it is necessary to re-design it on the basis of the modified design rule.

In order to solve such a problem, a compaction tool has been proposed (for example, Jpn. Pat. Appln. KOKAI Nos. 3-108738 and 8-287959) by which a design rule can be readily modified. This compaction tool is such that, if the design rule is modified, each portion of a design pattern can be individually reduced or modified so as to satisfy such a "modified" design rule.

When, on the other hand, the design rule is determined, its work processes are performed by only preparing a basic pattern close to an actual device pattern, predicting a pattern configuration on the wafer, by lithography simulation, etc., on the basis of the basic pattern and determining the design rule on the basis of results of such predictions.

However, the basic pattern used in the determination of the design rule does not always reflect the detail of a practical device pattern and there are cases where an actual device pattern is not formed, as designed, at those kinds of patterns not fully predicted by the simulation. Further, due to an increase in the number of design rules, an increase in choices of process procedures and the complexity of the data processing procedure, various factors need to be considered so as to determine individual design rules, and much time and effort is needed to determine the design rules. Still further, there are cases where the process procedure and data processing procedure cannot be determined until a design rule is proposed. It is, therefore, also necessary to prepare a plurality of design rules corresponding to the process procedure and data processing procedure.

Although, as set out above, the compaction tool capable of a faster design rule modification has been proposed, it is necessary to initially determine the design rules upon the processing by the compaction tool. Since, however, various difficulties as set out above have been encountered in determining the design rules, much time and effort is needed to determine the design rule. Further, the once-determined design rule is not always optimal and, when a practical device pattern is prepared with the use of the design pattern compacted by the compaction tool, there is a risk that the desired device pattern will not be obtained.

BRIEF SUMMARY OF THE INVENTION

In a first aspect of the present invention, a method for designing a semiconductor integrated circuit is provided which comprises compacting a design layout of a semiconductor integrated circuit on the basis of a given design rule to obtain a compacted pattern, predicting a pattern to be formed at a surface area of a wafer for forming the semiconductor integrated circuit on the basis of the compacted pattern, obtaining an evaluated value by comparing the predicted pattern with the compacted pattern, deciding whether the evaluated value satisfies a predetermined condition, and modifying the design rule when the evaluated value is decided as not satisfying the predetermined condition.

In a second aspect of the present invention, a system for designing a semiconductor integrated circuit is provided which comprises means for compacting a design layout of a semiconductor integrated circuit on the basis of a given design rule to obtain a compacted pattern, means for predicting a pattern to be formed at a surface area of a wafer for forming the semiconductor integrated circuit on the basis of the compacted pattern, means for obtaining an evaluated value by comparing the predicted pattern with the compacted pattern, means for deciding whether the evaluated value satisfies a predetermined condition, and means for modifying the design rule when the evaluated value is decided as not satisfying the predetermined condition.

In a third aspect of the present invention, a computer readable medium is provided which is configured to store program instructions for causing a computer to compact a design layout of a semiconductor integrated circuit on the basis of a given design rule to obtain a compacted pattern, causing the computer to predict a pattern to be formed at a surface area of a wafer for forming the semiconductor integrated circuit on the basis of the compacted pattern, causing the computer to obtain an evaluated value by comparing the predicted pattern with the compacted pattern, causing the computer to decide whether the evaluated value satisfies a predetermined condition, and causing the computer to modify the design rule when the evaluated value is decided as not satisfying the predetermined condition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 1:
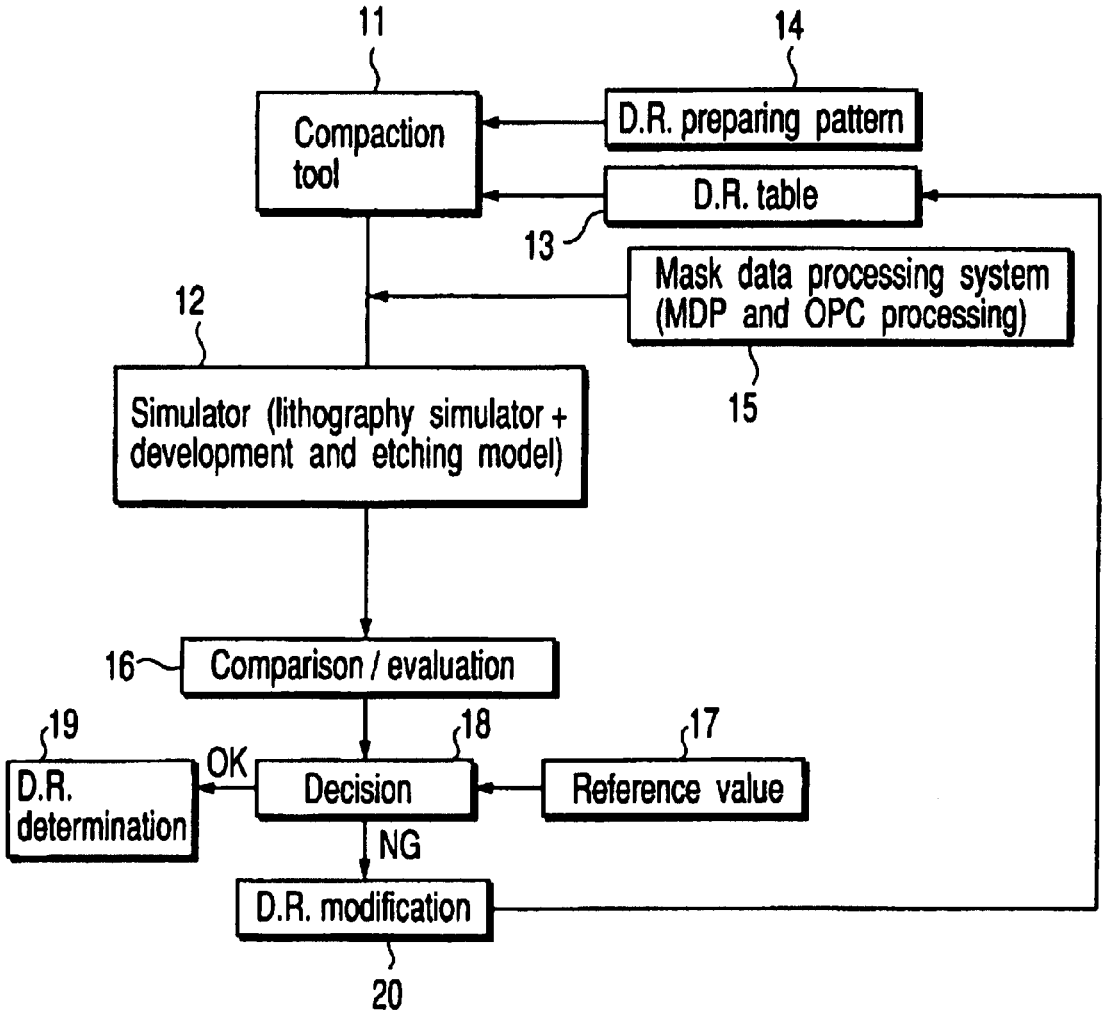
FIG. 1 is a functional block diagram showing a concept of a designing system according to an embodiment of the present invention.

An embodiment of the present invention will be described below with reference to the drawing.

FIG. 1 is a functional block diagram showing a concept of a designing system according to an embodiment of the present invention.

In the present system, a compaction tool 11 and simulator 12 coexist. The compaction tool 11 compacts a design layout so as to make the design layout area as small as possible. The simulator 12 predicts a pattern configuration formed at a surface area of a semiconductor wafer on the basis of the design layout.

To the compaction tool 11, a design rule table 13 for defining a design rule of a given generation and a design rule preparing pattern 14 for use in a design rule calculation are inputted. In the compaction tool 11, the design rule preparing pattern 14 is compacted in accordance with the design rule defined by the design rule table 13 and a "compacted" pattern is outputted to the simulator 12.

The simulator 12 includes the following simulators. A first is a lithography simulator (light intensity simulator or electron beam exposing simulator, etc.) for calculating a light exposed state on a wafer surface when a mask pattern is transferred by a light exposure device onto a resist formed on a wafer. A second is a simulator for calculating a pattern configuration of the resist which, after being pattern-transferred, is developed. A third is a simulator for calculating a configuration on a wafer surface following a pattern-working process (etching) done on the wafer surface area with a "developed" resist pattern used as a mask. A wafer surface pattern configuration is predicted, by the simulator 12, in the case of a given process condition being selected. It is noted that a device simulators for deciding a design rule or an LVS (Layout Versus Schematics) for comparing layout data with a circuit design may also be included if necessary.

In the present system, the compacted pattern data is converted to data for photolithography or electron beam lithography and a simulation is carried out using the "converted" data. Further, the present system has a mask data processing system 15 for performing mask data processing such as MDP processing, OPC processing, etc., and can perform mask data processing on a design pattern compacted by the compaction tool 11. By performing the simulation on the thus mask data processed pattern, it is possible to clarify a relation between an actually executable mask data processing and a definable design rule.

A wafer surface area's pattern configuration predicted by the simulator 12 and design pattern compacted by the compaction tool 11 are compared by a comparing/evaluating means 16. A great/small relation, etc., between an evaluated value obtained based on a result of comparison and an initially given reference value 17 is decided by a deciding means 18. In the case where a result of decision satisfies a predetermined condition, an earlier defined design rule is determined by a design rule determining means 19 as being a design rule of a device now under consideration. In the case where the result of decision does not satisfy the predetermined condition, the earlier defined design rule is modified (changed) by a design rule modifying (changing) means 20 to a new design rule and the new design rule is fed back to the design rule table 13.

Figure 2:
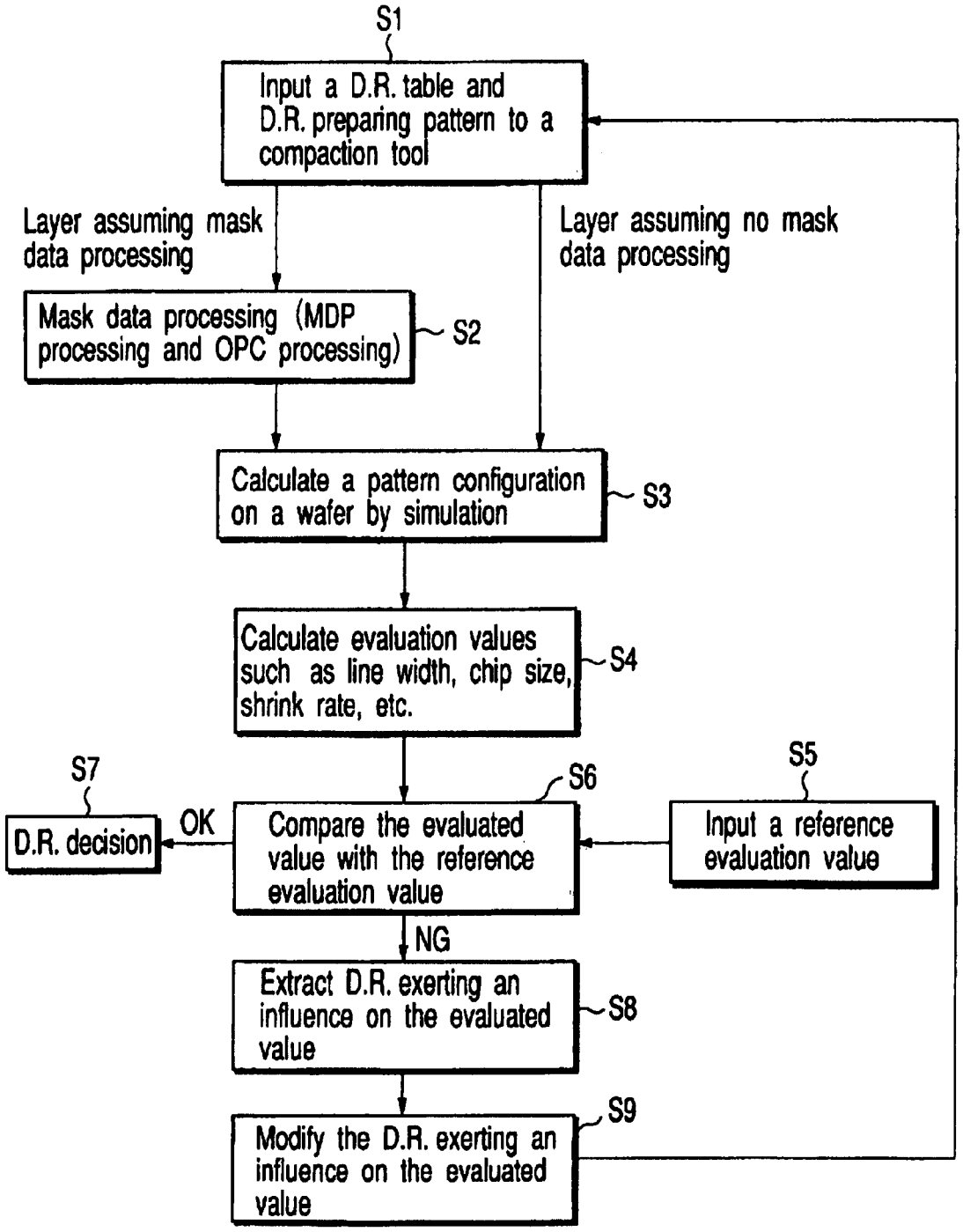
FIG. 2 is a flow chart showing an operation process of a designing method according to an example of the present invention.

Now the operation of the designing system according to the embodiment of the present invention will be explained below with reference to a flow chart shown in FIG. 2.

First, the design rule table and design rule preparing pattern are input to the compaction tool. The compaction tool compacts the designed pattern so as to satisfy a design rule designated by the design rule table (S1). As a design rule used as an initial value in the design rule table can be made of a rule obtained by uniformly shrinking, for example, a design rule of a previous generation. It is desirable that the design rule can prepare the same pattern shape as actual device pattern shape as possible. In a logic device, for example, it is desirable to use a standard cell pattern, etc. In the case of it being larger in scale, use is desirably made of a logic device pattern also involving the interconnection of an overlaying layer by a P&R (placement and routing) step.

Then, mask data processing is performed on the compacted pattern (S2). Since the assumed MDP processing and OPC processing differ from layer to layer, the mask data processing method is determined, taking into consideration the actual processing capability and TAT.

Then, a pattern configuration finally formed on a surface area of the wafer is predicted from the mask pattern prepared by the mask data processing with the use of the simulator mounted on the system (S3).

Then, those partially evaluated values such as a deviation amount of a line-width dimension from a desired dimension and a shortened amount of a dimension at a line end are calculated from the predicted pattern configuration and "compacted" design pattern. Further, the chip area, compaction shrink rate, etc., are also calculated as evaluation values (S4).

Then a reference evaluation value initially determined for each evaluation value is inputted (S5). Further, the calculated evaluation value and reference evaluation value are compared and it is decided whether or not the evaluation value satisfies the condition of the reference evaluation value (S6). In the case where the evaluation value satisfies the condition of the reference evaluation value, the earlier defined design rule is determined as the design rule of the device now under consideration (S7).

Then, a design rule exerting an influence on the calculated evaluation value is decided and this design rule is extracted (S8). In the case where, for example, a shortened amount of a gate layer portion projecting from a diffusion layer is greater than a reference evaluation value, the design rule defining a distance from the gate's forward end to the diffusion layer is so set larger as to satisfy the condition of the reference evaluation value. In the case where a contact hole is situated at a corner of the diffusion layer, since there is a risk that an electrical conduction will fail between the contact hole and the diffusion layer due to a rounding at the corner of the diffusion layer, the design rule defining a distance from the end of the diffusion layer to the contact hole is so set larger as to satisfy the reference evaluation value. Further, a route defining a chip size on a device is checked and a design rule exerting an influence on the route is extracted.

Then, the extracted design rule is modified toward a direction satisfying the condition of the reference evaluation value. Further, the modified design rule is fed back to the design rule table and the design rule of the design rule table is so modified as to allow at least one evaluation value to satisfy the condition of the reference evaluation value (S9).

By doing so, the above-mentioned steps are repeated until the calculated evaluation value satisfies the condition of the reference evaluation value.

By the way, the above-mentioned designing method can be realized by a computer having its operation controlled by a program loaded from a storage medium such as a magnetic disk.

According to the present embodiment, as set out above, the values of the design rules can be calculated with the use of an actual device pattern and it is, therefore, possible to calculate an exact design rule, in a shorter period of time, compatible with processes actually in use. Further, since this is a design rule also taking into consideration the mask data processing assumed to be done with an actual device, it is possible to compromise between the mask data processing time and the chip size increase resulting from less strict design rule. By providing the reference evaluation value, a faster decision is made for OK (good) or NG (no good) and, in addition, a readier numerical evaluation is also made on the design rule. Further, by distinguishing between the design rule exerting an influence on the evaluation value and other design rules, it is easier to decide whether any given design rule should be set stricter or any given design rule should be set more lenient and, by doing so, it is possible to easily judge to which patterns specific attention should be paid during the work-processing and mask data processing.

It is to be noted that the design rules may be prepared not only using the compaction tool and simulator as set out above but also additionally preparing an actual mask and performing a transfer test, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

[1. A method for designing a semiconductor integrated circuit, comprising:

compacting a design layout of a semiconductor integrated circuit on the basis of a given design rule to obtain a compacted pattern;

predicting a pattern to be formed at a surface area of a wafer for forming the semiconductor integrated circuit on the basis of the compacted pattern;

obtaining an evaluated value by comparing the predicted pattern with the compacted pattern;

deciding whether the evaluated value satisfies a predetermined condition; and modifying the design rule when the evaluated value is decided as not satisfying the predetermined condition.]

[2. A method according to claim 1, wherein the pattern formed at a surface area of a wafer is predicted using data obtained by converting data of the compacted pattern to mask data for photolithography or data for electron beam lithography.]

[3. A method according to claim 1, wherein the pattern formed at a surface area of a wafer is predicted using at least one model selected from a first prediction model, second prediction model and third prediction model, the first prediction model being a model for calculating a light exposed state of a resist on the wafer when the compacted pattern is projected on the resist, the second prediction model being a model for calculating a resist pattern configuration after the resist has been developed, and the third prediction model being a model for calculating a wafer surface configuration after the wafer has been work-processed using the resist pattern.]

[4. A system for designing a semiconductor integrated circuit, comprising:

means for compacting a design layout of a semiconductor integrated circuit on the basis of a given design rule to obtain a compacted pattern;

means for predicting a pattern to be formed at a surface area of a wafer for forming the semiconductor integrated circuit on the basis of the compacted pattern;

means for obtaining an evaluated value by comparing the predicted pattern with the compacted pattern;

means for deciding whether the evaluated value satisfies a predetermined condition; and means for modifying the design rule when the evaluated value is decided as not satisfying the predetermined condition.]

[5. A system according to claim 4, wherein the pattern formed at a surface area of a wafer is predicted using data obtained by converting data of the compacted pattern to mask data for lithography or data for electron beam lithography.]

[6. A system according to claim 4, wherein the pattern formed at a surface area of a wafer is predicted using at least one model selected from a first prediction model, second prediction model and third prediction model, the first prediction model being a model for calculating a light exposed state of a resist on the wafer when the compacted pattern is projected on the resist, the second prediction model being a model for calculating a resist pattern configuration after the resist has been developed, and the third prediction model being a model for calculating a wafer surface configuration after the wafer has been work-processed using the resist pattern.]

[7. A computer readable medium configured to store program instructions for causing a computer to compact a design layout of a semiconductor integrated circuit on the basis of a given design rule to obtain a compacted pattern, causing the computer to predict a pattern to be formed at a surface area of a wafer for forming the semiconductor integrated circuit on the basis of the compacted pattern, causing the computer to obtain an evaluated value by comparing the predicted pattern with the compacted pattern, causing the computer to decide whether the evaluated value satisfies a predetermined condition, and causing the computer to modify the design rule when the evaluated value is decided as not satisfying the predetermined condition.]

*8. A method for making a design layout of a semiconductor integrated circuit, executed by a computer programmed to perform the method, the method comprising:*

*executing the design layout, using a computer, by obtaining a pattern on the basis of a given design rule;*

*determining a predicted pattern to be formed at a surface area of a wafer, using a computer, on the basis of the obtained pattern;*

*obtaining an evaluated value, using a computer, by comparing the predicted pattern with the obtained pattern;*

*determining, using a computer, whether the evaluated value satisfies a predetermined condition; and*

*modifying the design layout, using a computer, when the evaluated value does not satisfy the predetermined condition.*

*9. A method for manufacturing a semiconductor device, comprising:*

*forming a circuit pattern on a semiconductor wafer based on the design layout made by the method according to claim 8.*

*10. A non-transitory computer readable storage medium encoded with a computer program product storing program instructions for causing a computer to perform the method according to claim 8.*

*11. A method for preparing an actual mask for a semiconductor integrated circuit, comprising:*

*preparing a design layout by obtaining a pattern on the basis of a given design rule;*

*determining a predicted pattern to be formed at a surface area of a wafer on the basis of the obtained pattern;*

*obtaining an evaluated value by comparing the predicted pattern with the obtained pattern;*

*determining whether the evaluated value satisfies a predetermined condition;*

*modifying the design layout when the evaluated value does not satisfy the predetermined condition; and*

*preparing an actual mask using the modified design layout.*

*12. A method for making a design layout of a semiconductor integrated circuit, executed by a computer programmed to perform the method, the method comprising:*

*preparing an extracted design rule by performing a test, using a computer;*

*executing the design layout, using a computer, by obtaining a pattern on the basis of the extracted design rule;*

*determining a predicted pattern to be formed at a surface area of a wafer, using a computer, on the basis of the obtained pattern;*

*obtaining an evaluated value, using a computer, by comparing the predicted pattern with the obtained pattern;*

*determining, using a computer, whether the evaluated value satisfies a predetermined condition; and*

*modifying the design layout, using a computer, when the evaluated value does not satisfy the predetermined condition.*

* * * * *